(12) United States Patent
Aggarwal et al.

(10) Patent No.: US 11,502,247 B2
(45) Date of Patent: Nov. 15, 2022

(54) MAGNETORESISTIVE DEVICES AND METHODS OF FABRICATING MAGNETORESISTIVE DEVICES

(71) Applicant: Everspin Technologies, Inc., Chandler, AZ (US)

(72) Inventors: Sanjeev Aggarwal, Scottsdale, AZ (US); Shimon, Singapore (SG); Kerry Joseph Nagel, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 17/134,683

(22) Filed: Dec. 28, 2020

(65) Prior Publication Data

US 2022/0209104 A1 Jun. 30, 2022

(51) Int. Cl.
| | |
|---|---|
| *H01L 43/14* | (2006.01) |
| *H01L 27/22* | (2006.01) |
| *H01L 43/04* | (2006.01) |
| *H01L 43/06* | (2006.01) |

(52) U.S. Cl.
CPC ............ *H01L 43/14* (2013.01); *H01L 27/228* (2013.01); *H01L 43/04* (2013.01); *H01L 43/06* (2013.01)

(58) Field of Classification Search
CPC ......... H01L 43/14; H01L 43/04; H01L 43/06; H01L 27/228
See application file for complete search history.

(56) References Cited

U.S. PATENT DOCUMENTS

| | | |
|---|---|---|
| 8,686,484 B2 | 4/2014 | Whig et al. |
| 8,747,680 B1 | 6/2014 | Deshpande et al. |
| 8,790,935 B1 | 7/2014 | Nagel et al. |
| 8,877,522 B2 | 11/2014 | Nagel et al. |
| 9,023,219 B2 | 5/2015 | Deshpande et al. |
| 9,136,464 B1 | 9/2015 | Whig et al. |
| 9,412,786 B1 | 8/2016 | Andre et al. |
| 9,419,208 B2 | 8/2016 | Whig et al. |
| 9,548,442 B2 | 1/2017 | Aggarwal et al. |
| 9,711,566 B1 | 7/2017 | Andre et al. |
| 9,722,174 B1 | 8/2017 | Nagel et al. |
| 10,461,251 B2 | 10/2019 | Aggarwal et al. |
| 10,483,460 B2 | 11/2019 | Nagel et al. |
| 10,600,460 B2 | 3/2020 | Deshpande et al. |
| 10,622,547 B2 | 4/2020 | Chia |
| 10,622,552 B2 | 4/2020 | Ikegawa et al. |
| 10,535,390 B2 | 6/2020 | Aggarwal et al. |
| 10,700,268 B2 | 6/2020 | Nagel et al. |
| 2013/0029431 A1* | 1/2013 | Takahashi ............... H01L 43/12 438/3 |

(Continued)

*Primary Examiner* — Latanya N Crawford Eason
(74) *Attorney, Agent, or Firm* — Bookoff McAndrews, PLLC

(57) ABSTRACT

A method of manufacturing a magnetoresistive device may comprise forming a first magnetic region, an intermediate region, and a second magnetic region of a magnetoresistive stack above a via; removing at least a portion of the second magnetic region using a first etch; removing at least a portion of the intermediate region and at least a portion of the first magnetic region using a second etch; removing at least a portion of material redeposited on the magnetoresistive stack using a third etch; and rendering at least a portion of the redeposited material remaining on the magnetoresistive stack electrically non-conductive.

20 Claims, 14 Drawing Sheets

(56) References Cited

U.S. PATENT DOCUMENTS

| | | | |
|---|---|---|---|
| 2018/0033957 A1* | 2/2018 | Zhang | H01L 43/12 |
| 2019/0140019 A1 | 5/2019 | Nagel et al. | |
| 2019/0140167 A1 | 5/2019 | Aggarwal et al. | |
| 2019/0157549 A1 | 5/2019 | Sun | |
| 2019/0165253 A1 | 5/2019 | Sun et al. | |
| 2019/0173004 A1 | 6/2019 | Deshpande et al. | |
| 2019/0312198 A1 | 10/2019 | Sun | |
| 2020/0294566 A1* | 9/2020 | Tsubata | H01L 43/08 |
| 2021/0399216 A1* | 12/2021 | Liu | H01L 43/12 |

* cited by examiner

MAGNETORESISTIVE DEVICES AND METHODS OF FABRICATING MAGNETORESISTIVE DEVICES

TECHNICAL FIELD

The present disclosure relates generally to magnetoresistive devices and methods of fabricating magnetoresistive devices.

INTRODUCTION

Magnetoresistive devices, such as magnetic sensors, magnetic transducers, and magnetic memory cells, include magnetic materials where the magnetic moments of those materials can be varied to provide sensing information or store data. Magnetoresistive devices, spin electronic devices, and spintronic devices are synonymous terms for devices that make use of effects predominantly caused by electron spin. Magnetoresistive memory devices are used in numerous information devices to provide non-volatile, reliable, radiation resistant, and high-density data storage and retrieval. The numerous magnetoresistive devices may include, but are not limited to, Magnetoresistive Random Access Memory (MRAM), magnetic sensors, and read/write heads for disk drives.

Manufacturing magnetoresistive devices includes a sequence of processing steps wherein multiple layers of materials are deposited and patterned to form a magnetoresistive stack and the electrodes used to provide electrical connections to the magnetoresistive stack. The magnetoresistive stack includes the various regions or layers that make up free and fixed regions of the device as well as one or more intermediate regions (e.g., dielectric layers) that separate these free and fixed regions, and in some cases, provide at least one tunnel junction for the device. In many instances, the layers of material in the magnetoresistive stack may be relatively very thin, e.g., on the order of a few or tens of angstroms. The term free refers to ferromagnetic regions having a magnetic moment that may shift or move significantly in response to applied magnetic fields or spin-polarized currents used to switch the magnetic moment vector of a free region. And, the term fixed refers to ferromagnetic regions having a magnetic moment vector that does not move substantially in response to such applied magnetic fields or spin-polarized currents.

In some applications, magnetoresistive devices may be included on the same integrated circuit with additional surrounding circuitry. For example, magnetoresistive devices (MRAMs, magnetic sensors, magnetic transducers, etc.) may be included on an integrated circuit with a microcontroller or other processing circuitry configured to utilize the information collected by, or stored in, the magnetoresistive devices.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments/aspects described herein. Further, the figures depict the different layers/regions of the illustrated stacks as having a uniform thickness and well-defined boundaries with straight edges. However, a person skilled in the art would recognize that, in reality, the different layers typically may have a non-uniform thickness. And, at the interface between adjacent layers, the materials of these layers may alloy together, or migrate into one or the other material, making their boundaries ill-defined. Descriptions and details of well-known features (e.g., interconnects, electrodes, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain features are illustrated with straight 90-degree edges, in reality such features may be more "rounded" and/or gradually sloping or tapered.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Figure 1:
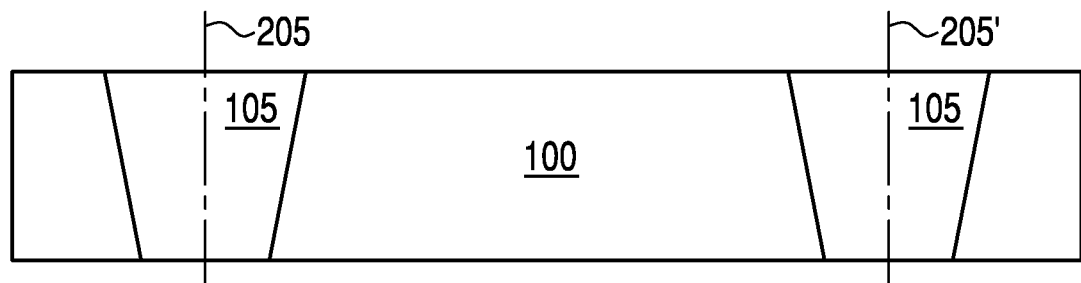
Figure 2:
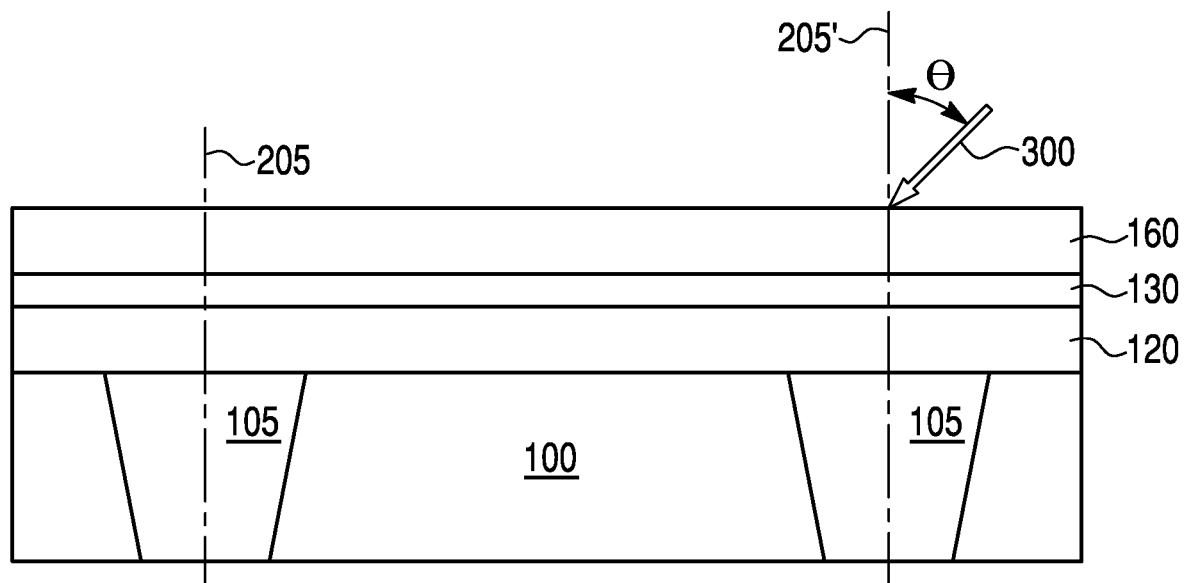
Figure 3A:
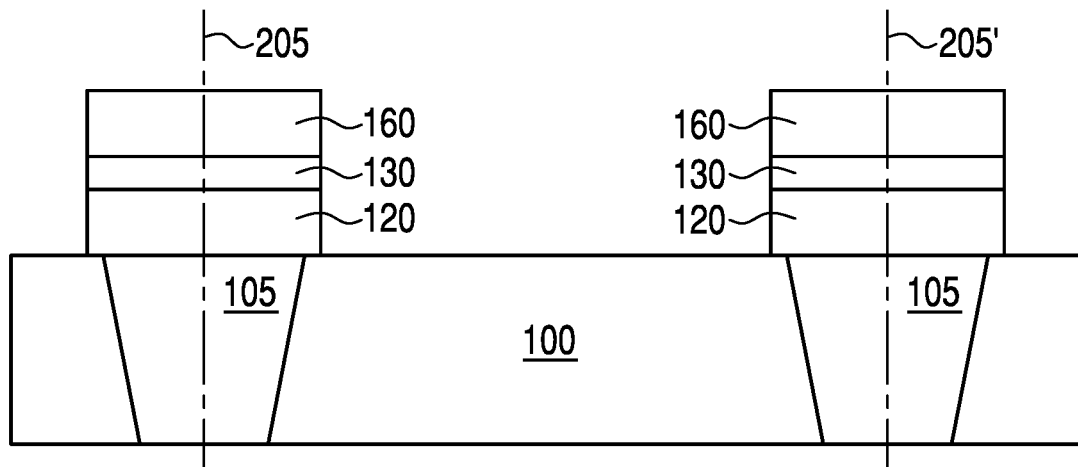
Figure 3B:
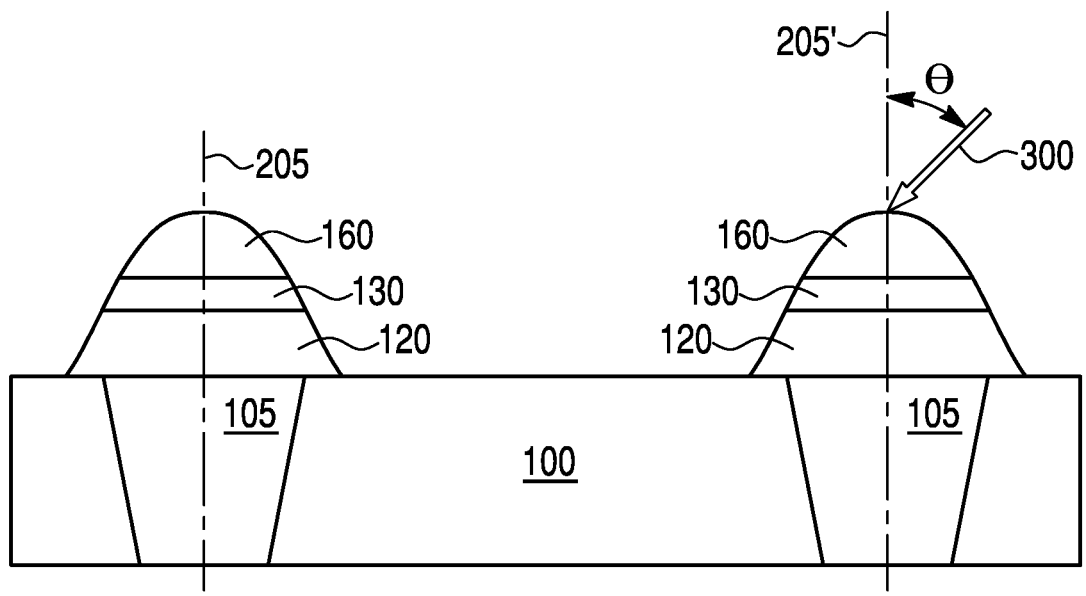
Figure 5A:
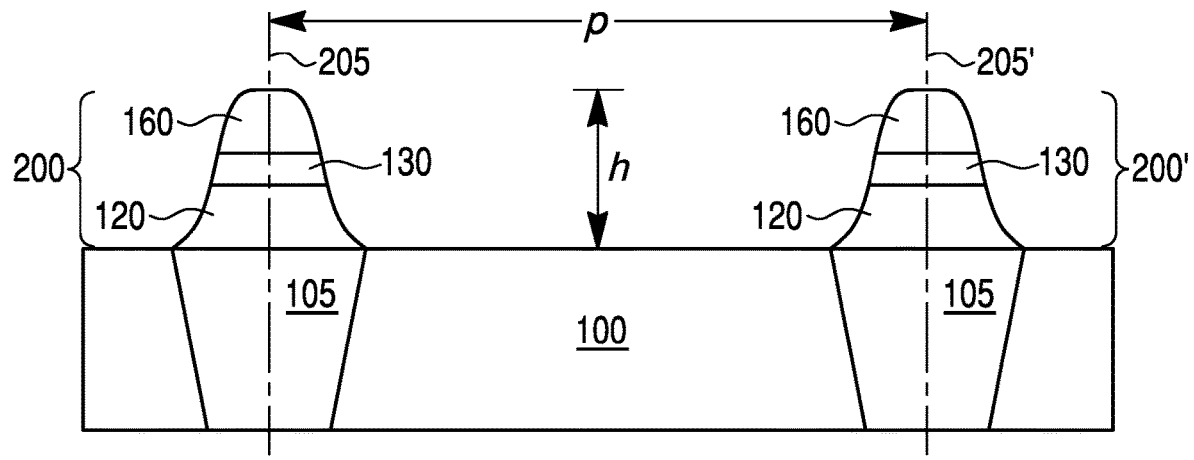
Figure 5B:
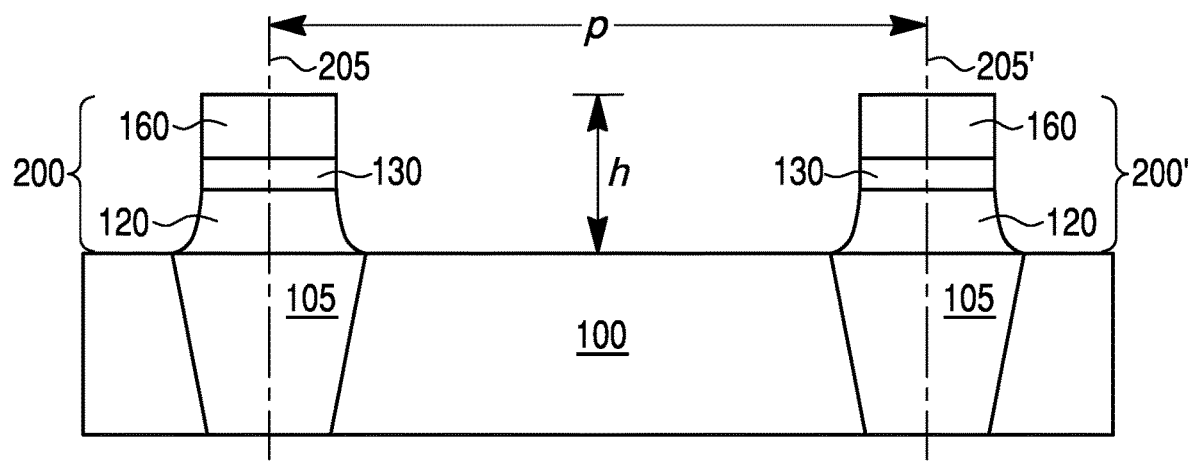
Figure 5C:
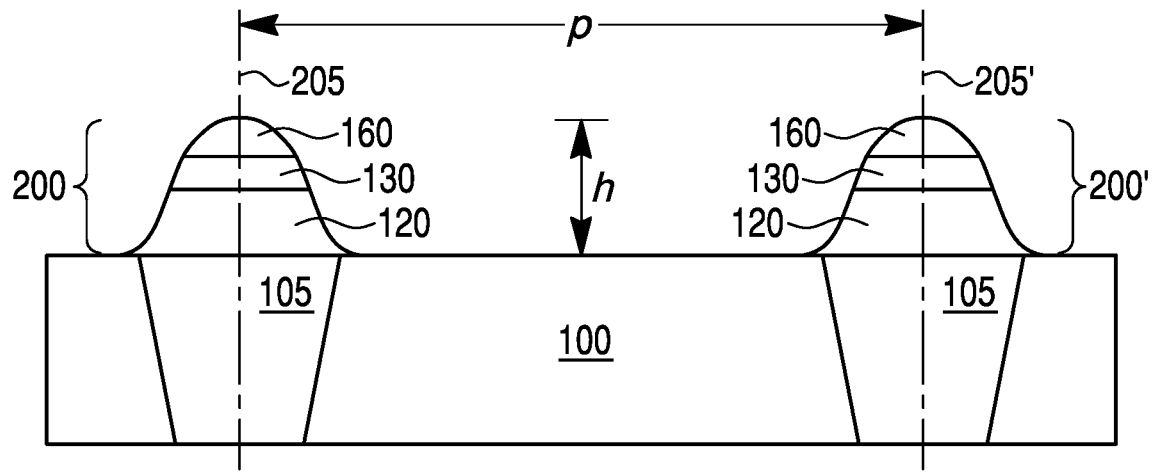
Figure 5D:
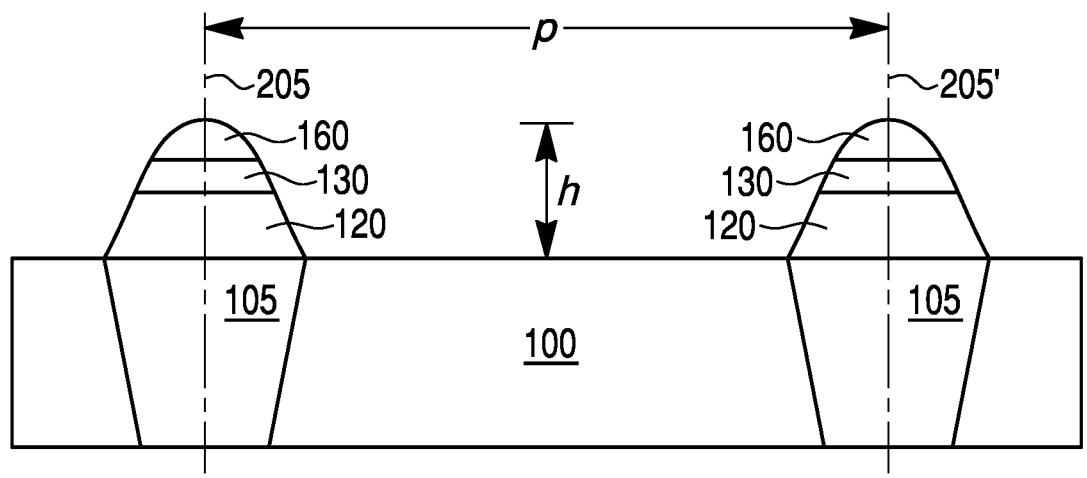
Figure 7A:
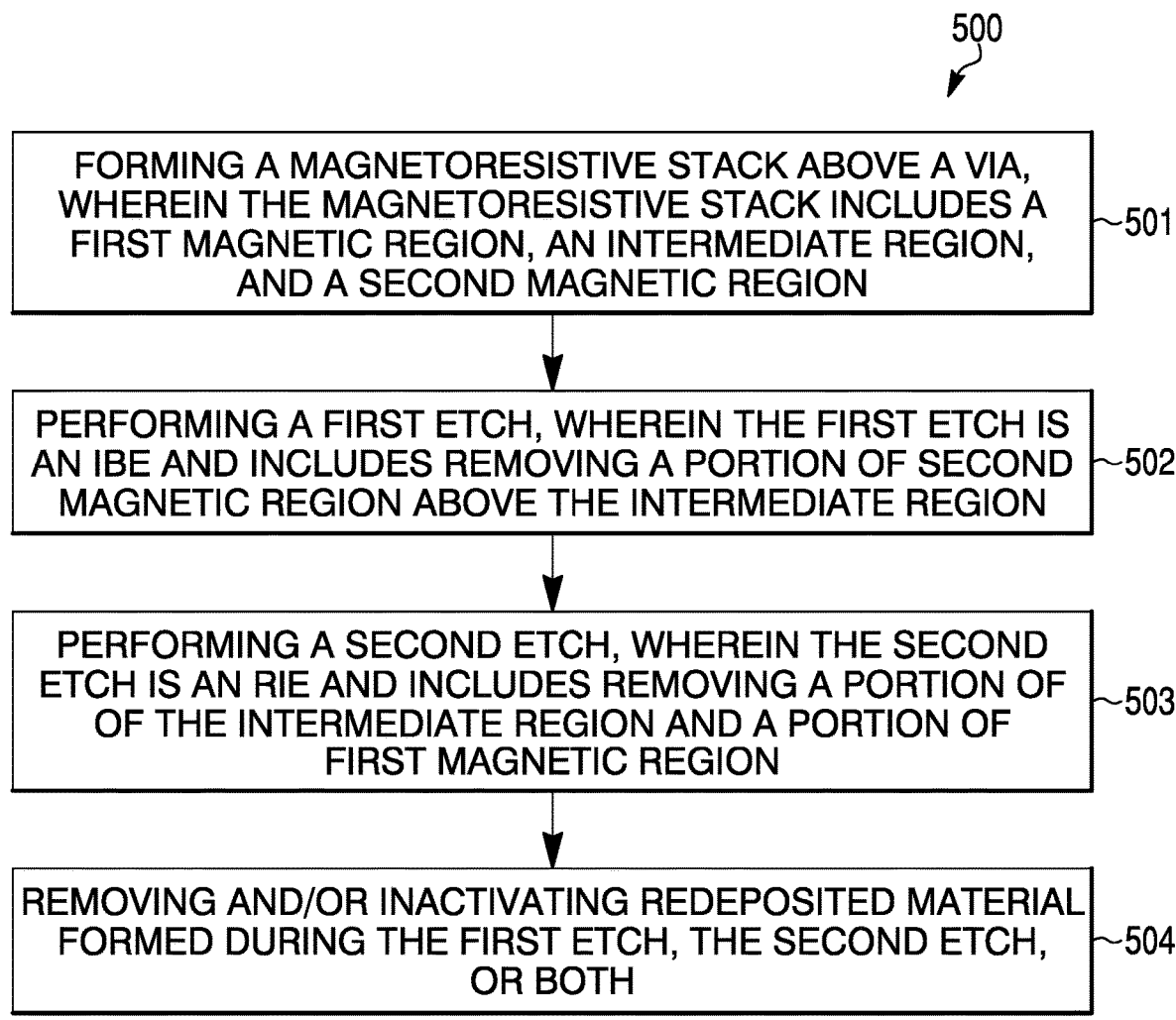
Figure 7B:
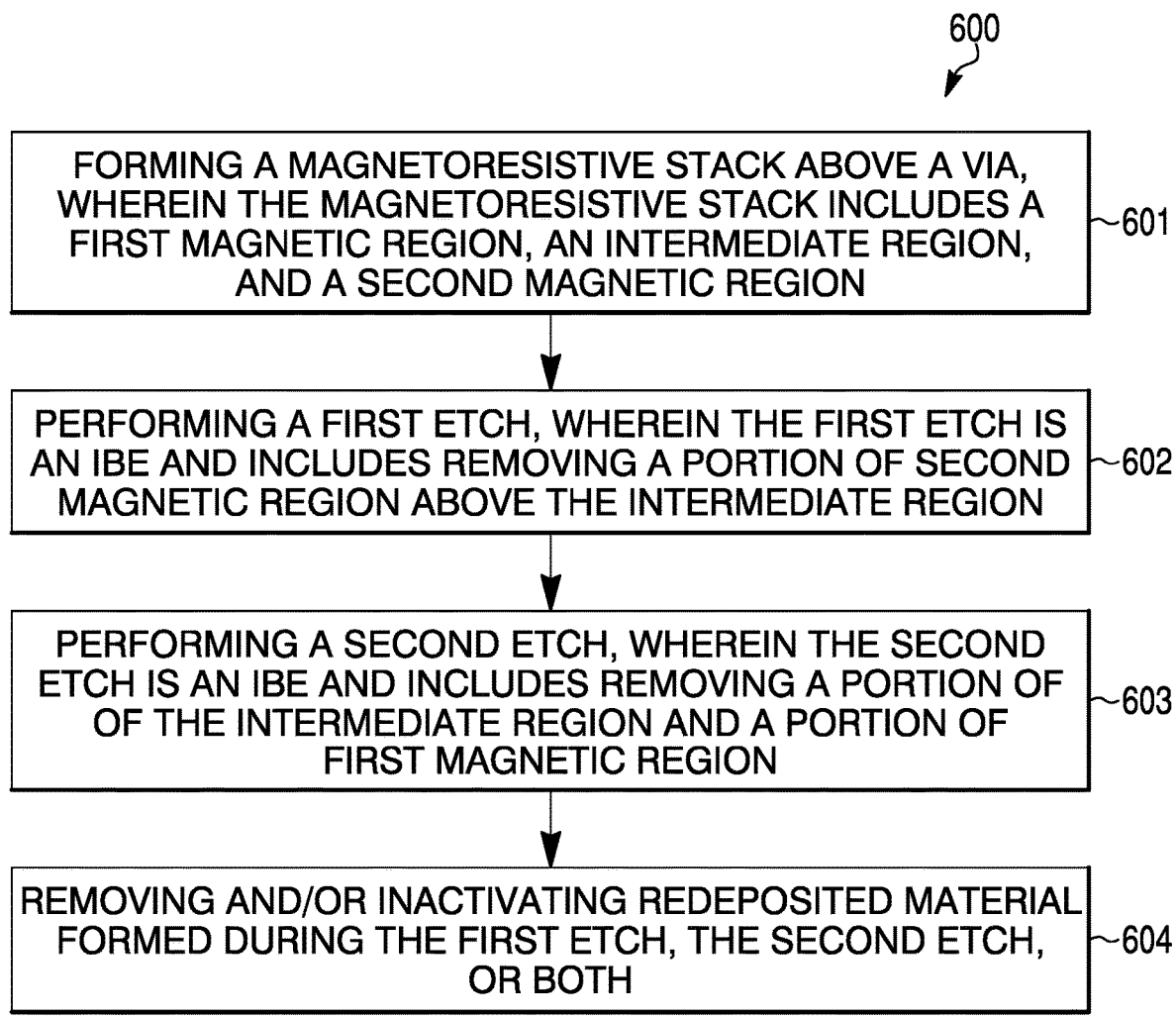
Figure 7C:
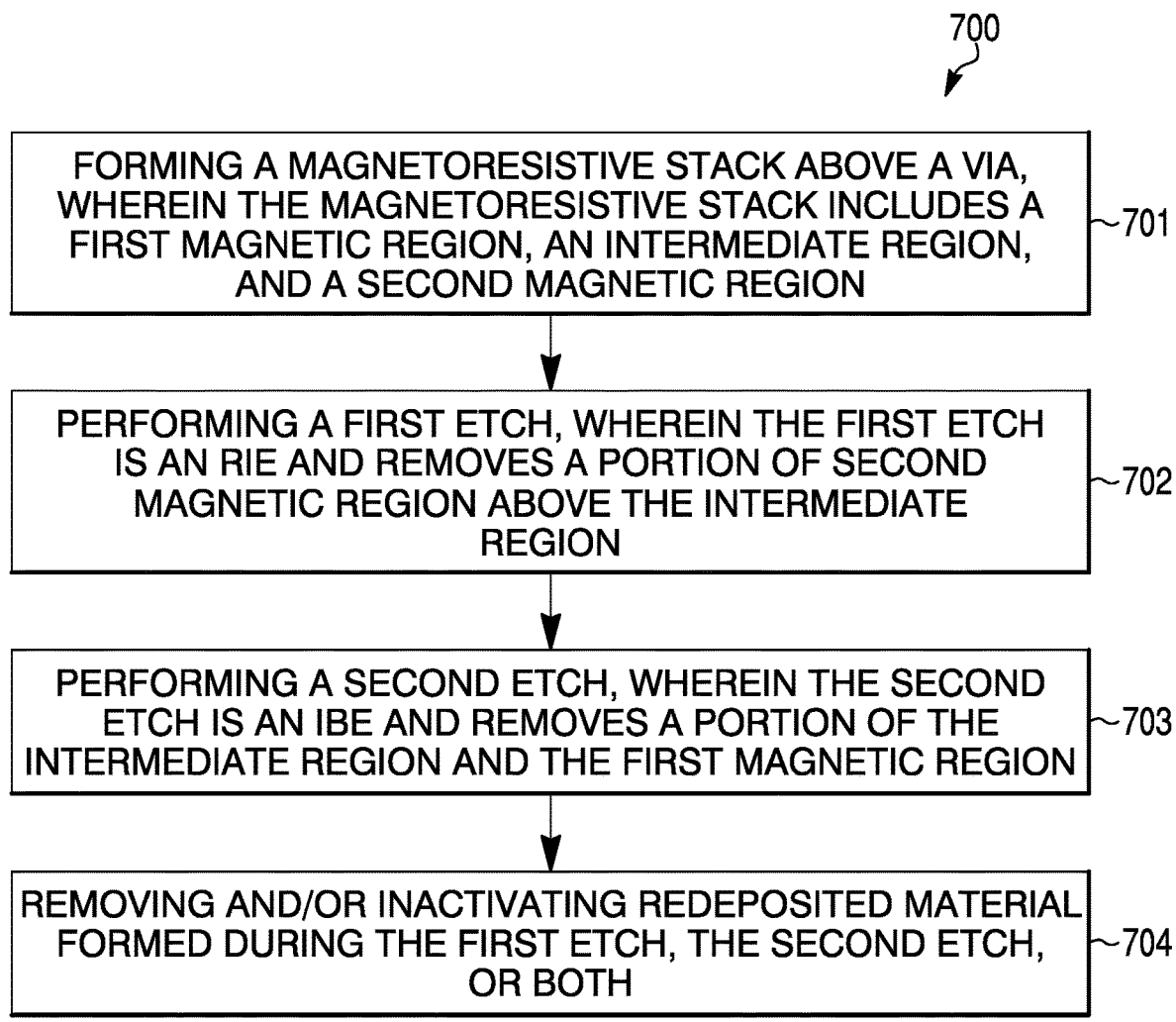
Figure 7D:
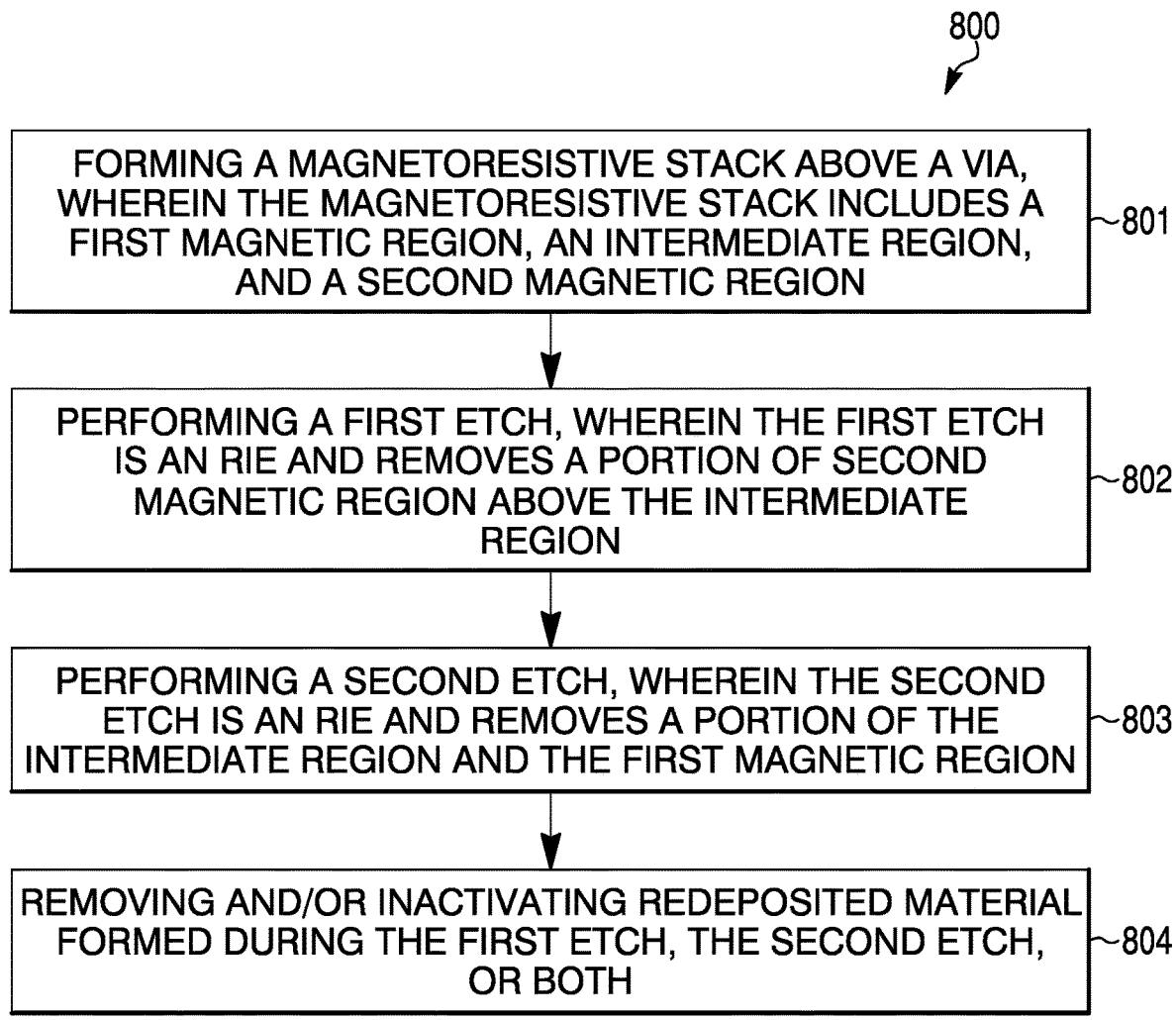
Figure 8A:
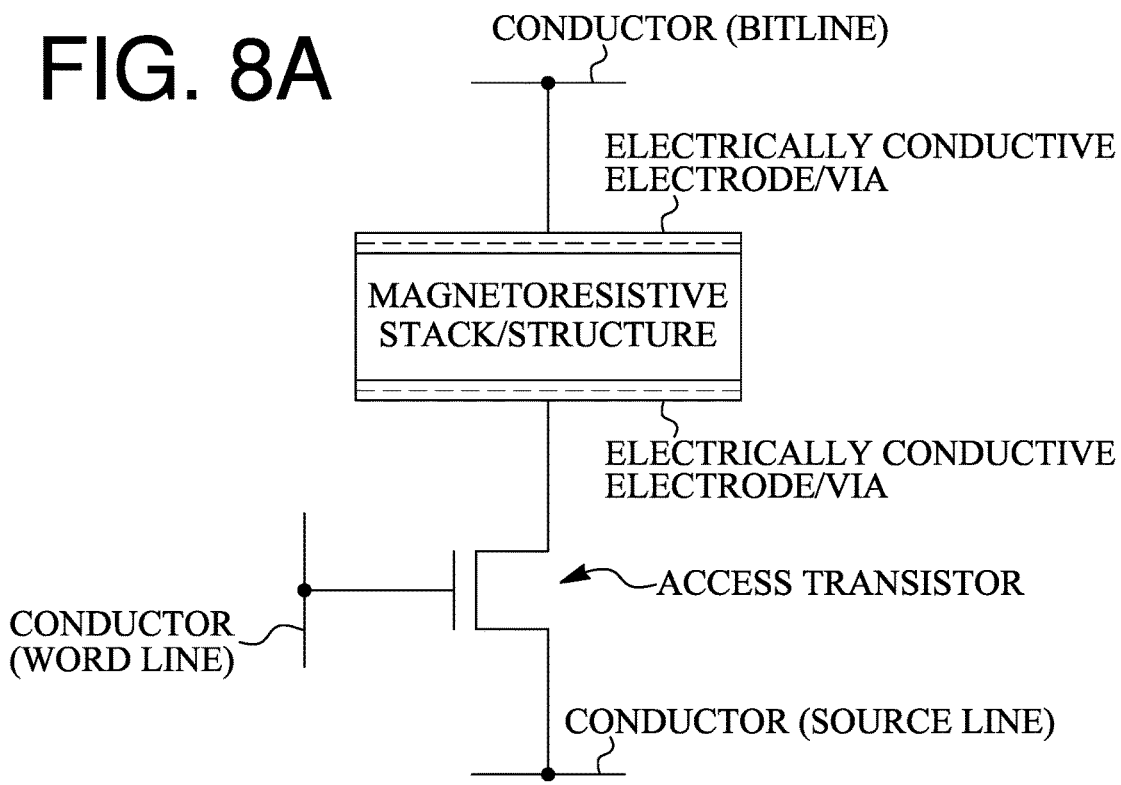
Figure 8B:
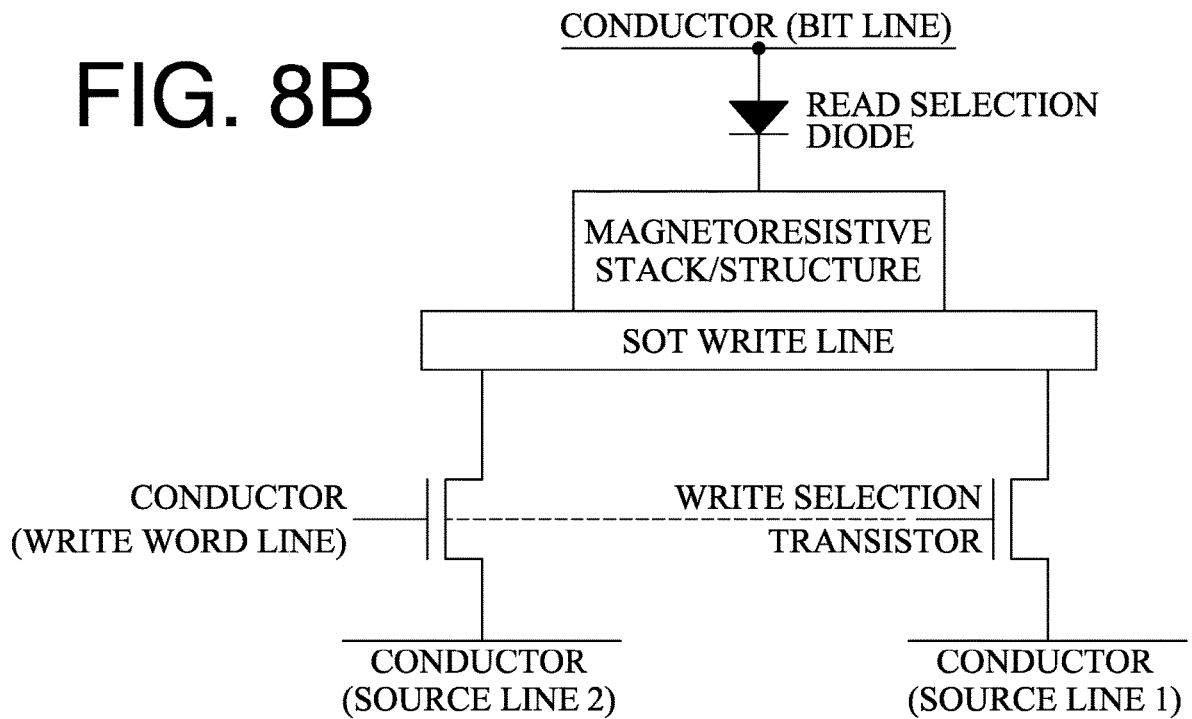
Figure 9A:
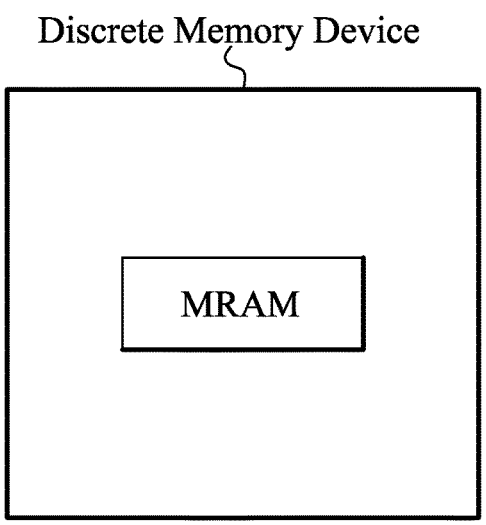
Figure 9B:
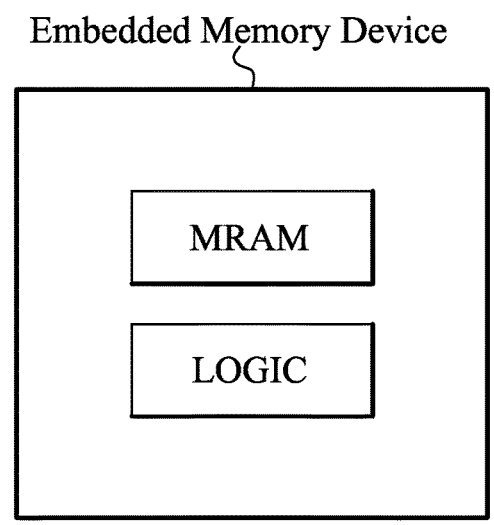

FIG. 1 illustrates a magnetoresistive structure during a manufacturing process, according to one or more embodiments of the present disclosure;

FIG. 2 illustrates a magnetoresistive structure during a manufacturing process, according to one or more embodiments of the present disclosure;

FIG. 3A illustrates a magnetoresistive structure during a manufacturing process, and after a first etch of a two-etch process, according to one or more embodiments of the present disclosure;

FIG. 3B illustrates a magnetoresistive structure during a manufacturing process, and after a first etch of a two-etch process, according to one or more embodiments of the present disclosure;

FIGS. 4A-4D illustrate magnetoresistive structures, each during a manufacturing process, and after a second etch of a two-etch process, according to one or more embodiments of the present disclosure;

FIGS. 5A-5D illustrate magnetoresistive structures, each during a manufacturing process, and after trimming of a redeposited material, according to one or more embodiments of the present disclosure;

FIGS. 6A-6D illustrate magnetoresistive structures, each during a manufacturing process, and after formation of an encapsulation material, according to one or more embodiments of the present disclosure;

FIG. 7A is a flowchart illustrating an exemplary fabrication process of the magnetoresistive structure of FIG. 5A, according to one or more embodiments of the present disclosure;

FIG. 7B is a flowchart illustrating an exemplary fabrication process of the magnetoresistive structure of FIG. 5B, according to one or more embodiments of the present disclosure;

FIG. 7C is a flowchart illustrating an exemplary fabrication process of the magnetoresistive structure of FIG. 5C, according to one or more embodiments of the present disclosure;

FIG. 7D is a flowchart illustrating an exemplary fabrication process of the magnetoresistive structure of FIG. 5D, according to one or more embodiments of the present disclosure;

FIG. 8A is a schematic diagram of an exemplary magnetoresistive memory stack electrically connected to a select device, e.g., an access transistor, in a magnetoresistive memory cell configuration;

FIG. 8B is a schematic diagram of an exemplary magnetoresistive stack electrically connected to a spin-orbit-torque write line and a select device, e.g., a selection transistor, in a magnetoresistive memory cell configuration; and FIGS. 9A and 9B are schematic block diagrams of integrated circuits including a discrete memory device and an embedded memory device, respectively, each including an MRAM (which, in one embodiment is representative of one or more arrays of MRAM having a plurality of magnetoresistive memory structures according to aspects of certain embodiments of the present disclosure).

DETAILED DESCRIPTION

There are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate that the embodiment(s) is/are "example" embodiment(s). Further, even though the figures and this written disclosure appear to describe a particular order of construction (e.g., from bottom to top), it is understood that the depicted structures may have the opposite order (e.g., from top to bottom), or a different order.

As used herein, the term "approximately" is meant to account for variations due to experimental error. When applied to numeric values, the terms "about" and "approximately" may indicate a variation of +/−5% from the disclosed numeric value, unless a different variation is specified. When applied to angle measures, the terms "about" and "approximately" may indicate a variation of +/−3°. As used herein, the singular forms "a," "an," and "the" include plural referents unless the context clearly dictates otherwise. Further, all ranges are understood to be inclusive of endpoints, e.g., from 1 nanometer (nm) to 5 nm would include lengths of 1 nm, 5 nm, and all distances between 1 nm and 5 nm.

Unless defined otherwise, all terms of art, notations and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein are admitted to be prior art to the current disclosure.

For the sake of brevity, conventional techniques related to semiconductor processing may not be described in detail herein. The exemplary embodiments described herein may be fabricated using known lithographic processes. The fabrication of integrated circuits, microelectronic devices, micro electro mechanical devices, microfluidic devices, and photonic devices may involve the creation of several layers of materials that interact in some fashion. One or more of these layers may be patterned so various regions of the layer have different characteristics (e.g., electrical characteristics), which may be interconnected within the layer or to other layers to create electrical components and circuits. These regions may be created by selectively introducing or removing various materials. The patterns that define such regions are often created by lithographic processes.

The methods described herein enable the fabrication of magnetoresistive devices with tighter pitches (e.g., the distance between the center of one magnetoresistive stack and the center of an adjacent magnetoresistive stack), while preventing electric shorting that might result from redeposited etched materials and limiting damage to the magnetic tunnel junction (MTJ) from the fabrication process (e.g., oxidation of intermediate region). For example, during conventional manufacturing processes, etching and/or oxidation techniques may be undertaken that remove redeposited etched materials, but also cause damage or oxidize one or more layers of magnetoresistive stack. The oxidation damage may cause an electrical short and/or reduce the switching efficiency of the magnetoresistive stack. Embodiments of the present disclosure include methods for removing redeposited material while limiting damage to the magnetoresistive stack.

Magnetoresistive devices, electrical components, and integrated circuits (e.g., transistors, capacitors, diodes, etc.) may be fabricated on a semiconductor wafer. Connections between circuit components and magnetoresistive structures may be integrated in multiple vertically stacked levels of interconnects (e.g., metal layers). The multiple metal layers, and the interconnects of each metal layer, are separated from each other by one or more dielectric materials (e.g., interlayer dielectrics) that electrically isolate the different metal layers. Vias between the different metal layers provide electrical connection between the different metal layers.

Magnetoresistive devices may include a plurality of magnetoresistive structures embedded therein (e.g., between metal layers and/or vias). A magnetoresistive structure may include a plurality of magnetic material layers (or regions) separated by one or more intermediate regions. In some embodiments, these intermediate regions may be made of a dielectric material and may form one or more tunnel junctions. For example, in some embodiments, magnetoresistive structures may include dielectric layer disposed between a first magnetic region (e.g., a fixed magnetic region) and a second magnetic region (e.g., a free magnetic region). In some examples, the insulating dielectric layer may be replaced with a conductive layer (e.g., a copper layer) sandwiched between the free and fixed regions.

Referring to FIG. 1, one or more interlayer dielectric layers (ILD) 100 may fill the space between the metal layers (not pictured) and vias 105. ILD 100 may be deposited over the features of one or more metal layers. ILD 100 may include a conventional ILD material (such as, for example, TEOS, $SiO_2$, etc.) and/or a low-k ILD material (such as, for example, carbon doped $SiO_2$ (SiOC), carbon doped oxide (CDO), organosilicate glass (OSG), spin-on organics, etc.). Although a single ILD 100 is illustrated in drawings, this is only exemplary. In some embodiments, multiple ILDs 100 may be used. For example, some regions of the device (e.g., metal layers or portions of metal layers) may use one type of ILD 100 (e.g., a conventional ILD) and other regions of the device may use another types of ILD 100 (e.g., a low-k ILD). See, for example, U.S. Patent Application Publication No. 2019/0140019, which is incorporated by reference in its entirety.

After the ILD 100 is deposited and patterned using lithography and etching techniques to form cavities or trenches, the cavities or trenches may be filled with a conductive material to form vias 105. Referring to FIGS. 1-6D, structures including the magnetoresistive stacks and vias 105 may be formed within and/or on the deposited ILD 100, for example, within one or more cavities or trenches formed in the ILD 100 via a dual-damascene process.

Referring to FIG. 1, several vias 105 may be formed in the ILD 100. After forming the vias 105, a top surface of the vias 105 and ILD 100 may be leveled, smoothed, or polished by any conventional technique (e.g., chemical-mechanical planarization (CMP)). A normal axis 205 may pass through the via 105. The normal axis 205 may be perpendicular to a top surface of the via 105 and, in some embodiments, may pass through the center of an adjacent magnetoresistive stack.

Referring now to FIG. 2, multiple layers of materials that will form different regions of the stacks (e.g., the first magnetic region 120, intermediate region 130, and second magnetic region 160) may be sequentially deposited (e.g., deposited one over the other) on the planarized surface of the ILD 100 and/or via 105. These multiple layers may include the materials for the first magnetic region 120, intermediate region 130, and/or second magnetic region 160. In other words, the deposited multiple layers will eventually form the one or more magnetoresistive stacks including the first magnetic region 120, intermediate region 130, and/or second magnetic region 160, after being modified via the processes described in the present disclosure.

The multiple layers of materials that may form different regions of a magnetoresistive stack are described in references incorporated herein, and therefore are not discussed in detail herein. Possible compositions and/or layers that may constitute the exemplary magnetoresistive stack 200, 200' are described in, for example, U.S. Pat. Nos. 8,686,484; 8,747,680; 9,023,219; 9,136,464; 9,412,786; 9,419,208; 9,722,174; 10,461,251; 10,483,460; and 10,700,268; and U.S. Patent Application Publication No. 2019/0173004, each of which is incorporated by reference in its entirety.

Magnetoresistive stacks may be formed above the via 105. In some embodiments, the magnetoresistive stacks may include a first magnetic region 120, an intermediate region 130 (e.g., a dielectric layer), and a second magnetic region 160. In some embodiments, the first magnetic region 120 may be a free magnetic region and the second magnetic region 160 may be a fixed magnetic region. In other embodiments, the first magnetic region 120 may be a fixed magnetic region and the second magnetic region 160 may be a free magnetic region. In some embodiments, the first magnetic region 120 and the second magnetic region 160 (e.g., the fixed region and the free region) may each include one or more layers of magnetic or ferromagnetic materials. The one or more layers of magnetic or ferromagnetic materials may comprise nickel (Ni), iron (Fe), and cobalt (Co), palladium (Pd), platinum (Pt), magnesium (Mg), manganese (Mn), chromium (Cr), boron (B), alloys thereof, and/or combinations thereof. In some embodiments, the first magnetic region 120, the second magnetic region 160, or both, may comprise one or more synthetic antiferromagnetic structures (SAF) or synthetic ferromagnetic structures (SyF). One or more layers of magnetic or ferromagnetic materials may include one or more non-magnetic layers (e.g., as a coupling layer of a SAF or SyF) including ruthenium (Ru), copper (Cu), aluminum (Al), tantalum (Ta), titanium (Ti), niobium (Nb), vanadium (V), zirconium (Zr), iridium (Ir), tungsten (W), molybdenum (Mo), alloys thereof, and/or combinations thereof.

The intermediate region 130 (e.g., a dielectric layer) may include, for example, one or more layers of aluminum oxide and/or magnesium oxide. The magnetoresistive structure may also include a bottom electrode, a top electrode, and/or a spin-orbit torque line (e.g., spin-Hall material). Electrodes (e.g., bottom electrodes or top electrodes) may be formed of any electrically conductive material that enables the magnetoresistive structure to be accessed by surrounding circuitry. For example, electrodes may include one or more metals (e.g., copper (Cu)), tantalum (Ta), titanium (Ti), tungsten (W), conductive nitrides (e.g., tantalum-nitride alloy).

A spin-orbit torque line (e.g., spin-Hall material) may be incorporated in magnetoresistive structures that utilize spin-orbit torque (SOT) switching mechanics. See, for example, U.S. Pat. Nos. 10,600,460; 10,622,547; and U.S. Patent Application Publication No. 2019/0312198.

In some embodiments, a capping layer may be provided above the second magnetic region 160. The capping layer may provide a barrier to migration for a proximate metal layer (e.g., prevent or reduce copper diffusion). The capping layer may also act as an etch stop during fabrication of the overlying structures (e.g., during etching of the overlying vias). The capping layer may include any material suitable for these functions. In some embodiments, a capping layer may include materials, such as, for example, silicon carbide (SiC), silicon nitride (SiN), a nitrogen-doped silicon carbide (e.g., NBLoK from Applied Materials, Inc.), etc.

In addition to the regions described above, a magnetoresistive stack may include a third magnetic region and a second intermediate region (e.g., a dual-spin filter configuration). As would be recognized by a person skilled in the art, the magnetoresistive structures and stacks described herein may also include additional layers not shown, such as, for example, seed layers, transition layers, etch stop layers, barrier layers, etc. Since exemplary materials and layers of magnetoresistive devices, and their functions, are well known in the art, they are not described in detail herein. A specific configuration of a magnetoresistive stack is illustrated in the drawings for clarity. However, the magnetoresistive structures described herein may include any type of magnetoresistive stack known in the art. In general, the magnetoresistive structures may be any type of in-plane or out-of-plane (i.e., perpendicular) magnetically anisotropic MTJ device, and may include any type of now-known or later developed magnetoresistive stack.

In describing the methods and processes of the present application, reference will be made to FIGS. 1-6D and the magnetoresistive stacks 200, 200' and structures shown therein. For clarity, the drawings (e.g., FIGS. 4A-6D) show magnetoresistive stacks 200, 200' including a first magnetic region 120, an intermediate region, 130, and a second magnetic region 160. It should be understood that the methods and processes described herein may be applied to fabrication processes of various types of magnetoresistive stacks or MTJ devices, such as, for example, those described in U.S. Pat. Nos. 8,686,484; 8,747,680; 9,023,219; 9,136,464; 9,419,208; 10,535,390; 10,622,552, and U.S. Patent Application Publication Nos: 2019/0165253; 2019/0173004; 2019/0140167; and 2019/0157549, each of which is incorporated by reference.

After the layers that constitute the first magnetic region 120, intermediate region 130, and second magnetic region 160 are formed, a hard mask layer may be deposited over each of the stacks 200, 200' (e.g., over a top electrode layer). The hard mask layer may serve as a hard mask during subsequent processing (etching, patterning, etc.) of the magnetoresistive stacks 200, 200' to form magnetoresistive structures. For example, a hard mask layer may protect the underlying layers of the stack 200, 200' from reactive compounds and gases used in the etching processes used to form magnetoresistive structures. In some embodiments, materials such as, for example, silicon oxide, silicon nitride, and/or another material that is relatively inert to the reactants used during subsequent processing, may be deposited to form a hard mask layer. In some embodiments, a hard mask layer may be a metal hard mask, and may include one or more layers of metals, such as, for example, platinum (Pt), iridium (Ir), molybdenum (Mo), tungsten (W), ruthenium (Ru), and alloys, such as, for example, titanium-nitride (TiN), platinum manganese (PtMn), iridium-manganese (IrMn), etc. Some exemplary hard masks are described in U.S. Pat. No. 9,023,219, which is incorporated by reference in its entirety.

Any known etching process, for example, sputter etching, ion beam etching (e.g., angled ion beam etching), reactive ion beam etching, milling, or later developed etching process may be used to etch through the different blanket layers to form the magnetoresistive structures described herein.

Ion beam etching may include using an ion beam (e.g., comprising argon (Ar), krypton (Kr), xenon (Xe), or other ionized plasma) to remove at least a portion of one or more regions of a magnetoresistive structure. The ion beam may be parallel to the normal axis 205, 205' of the magnetoresistive stacks 200, 200' (e.g., perpendicular to a top surface of a layer of material being etched).

In some embodiments, the ion beam 300 may be at an angle θ incident to the normal axis 205, 205' of the magnetoresistive stacks 200, 200' (see, for example, FIG. 2). In other words, during an ion beam etch, the ion beam 300 and normal axis 205, 205' may define a non-zero angle θ. This is referred to as angled ion beam etching. In some embodiments, angled ion beam etching at a small angle θ (e.g., less than or equal to approximately 35°) may result in more damage to regions of the formed magnetoresistive structure (e.g., oxidation of the intermediate region 130). However, conventional methods of manufacturing magnetoresistive devices including angled ion beam etching at a large angle θ (e.g., greater than approximately) 35° limit the dimensions (e.g., height and/or pitch) of the magnetoresistive structures that can be formed.

In addition to ion beam etching, methods described herein, such as, for example, two-step etch processes, may include reactive ion etching. Reactive ion etching refers to an etching techniques that introduces reactive species, such as, for example, reactive plasma into a controlled environment (e.g., vacuum or inert gas atmosphere) containing the magnetoresistive structure to be etched. The reactive species interact with the materials of the magnetoresistive structure, etching away portions of the materials. In addition, or alternatively, to reactive species, the etch may include using inert species (argon, krypton, xenon, etc.). For example, the etch may be performed with a mixture of inert and reactive species. The materials being etched, the depth of the etch, and the shape of the etch may be controlled by the strength and/or type of the reactive species, by an inducted field (e.g., an RF field, a magnetic field, etc.) or by alterations to the process variables (temperature, pressure, bias power, field strength, etc.)

Methods described herein may incorporate ion beam etching (e.g., angled ion beam etching) with reactive ion etching to manufacture magnetoresistive devices with narrow dimensions (e.g., shorter pitches) and with minimal or significantly-reduced damage to the regions of the magnetoresistive devices. As used herein, IBE may refer to physical ion beam etching (e.g., angled IBE), causing ablation of one or more materials being etched, and RIE may refer to reactive ion etching (e.g., processes including introduction of reactive and/or inert species under controlled chamber conditions to remove materials being etched).

Figure 4A:
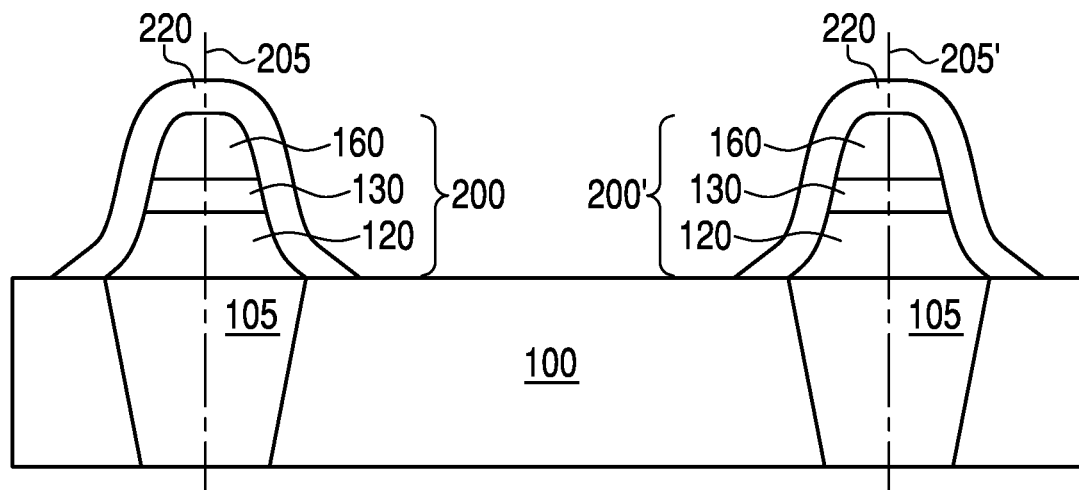
Figure 6A:
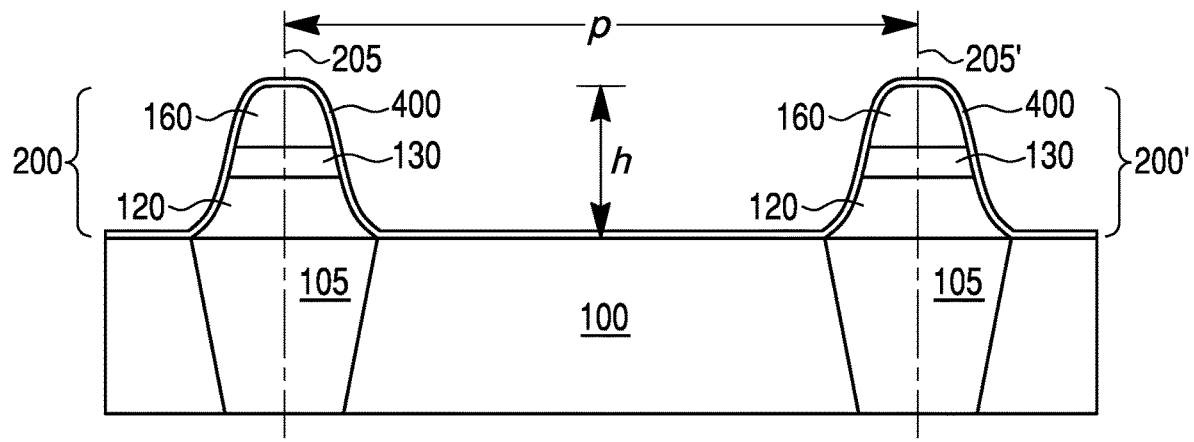
Figure 6B:
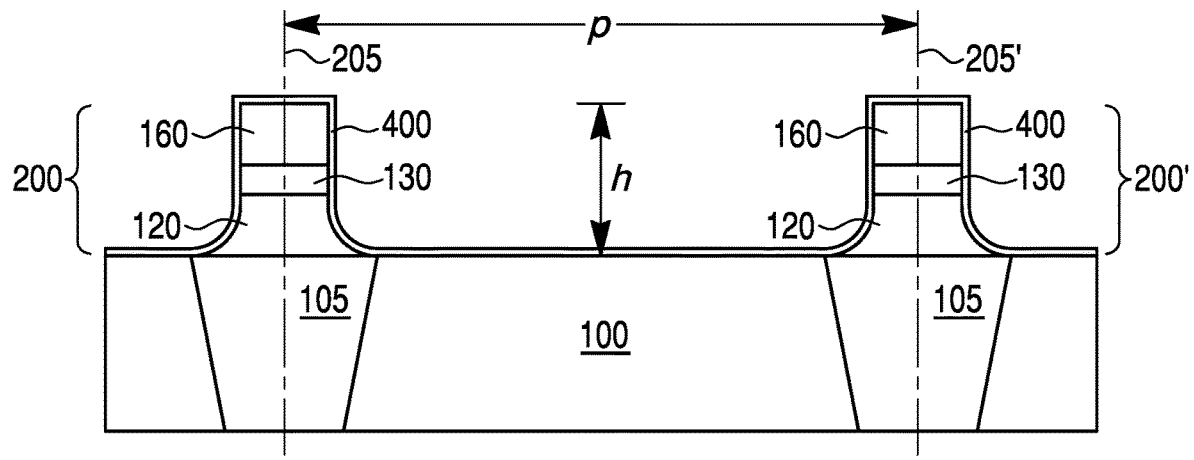
Figure 6C:
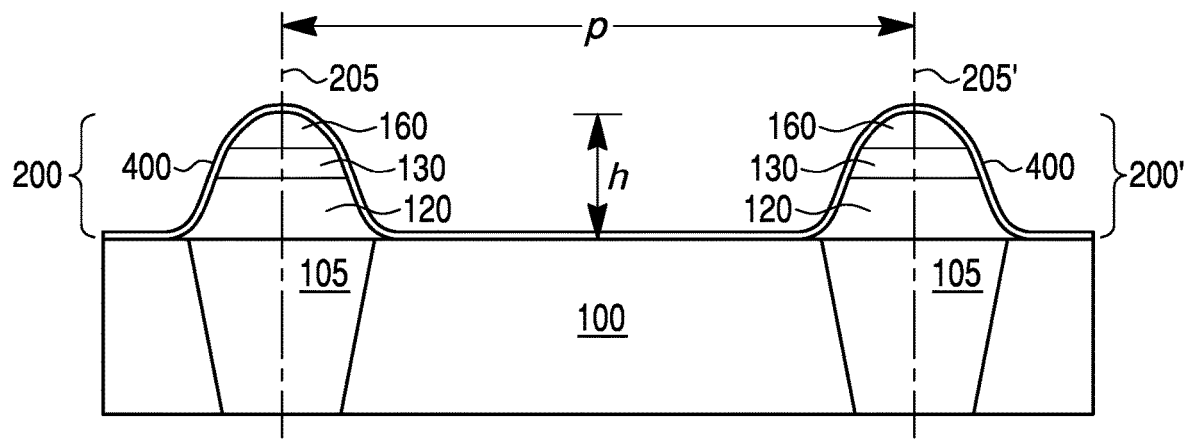
Figure 6D:
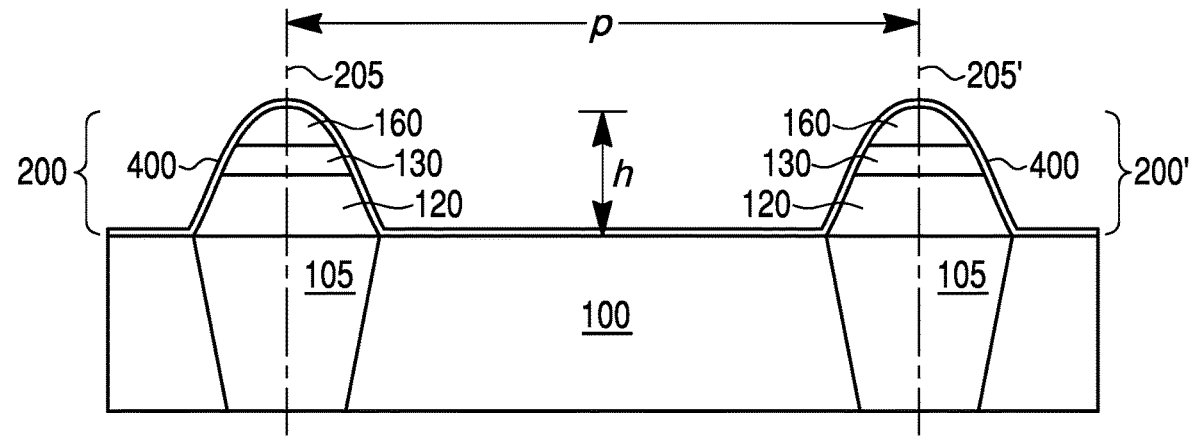

In addition to other fabrication steps, magnetoresistive stacks 200, 200' are manufactured using a two-step etch process. For example, FIGS. 4A, 5A, and 6A show magnetoresistive stacks 200, 200' formed using an angled ion-beam etch (IBE), then a reactive ion etch (RIE); the process shown in FIGS. 4B, 5B, and 6B includes a first IBE, then a second IBE; FIGS. 4C, 5C, and 6C illustrate a process including a RIE, then an IBE; and FIGS. 4D, 5D, and 6D show magnetoresistive stacks 200, 200' manufactured using a first RIE, then a second RIE.

The two-step etch processes may be used to manufacture magnetoresistive structures with improved pitch p and height h characteristics. For example, a normal axis 205 may pass through a magnetoresistive stack 200 and its corresponding via 105. The normal axis 205 may be perpendicular to the top surface of the via 105 and may pass through the center of the magnetoresistive stack 200. The distance between the center of the magnetoresistive stack 200 and the center of an adjacent magnetoresistive stack 200' (e.g., distance between the normal axis 205 and an adjacent normal axis 205') may be referred to as the pitch p. The height h may refer to the total height of the magnetoresistive stacks 200 and 200', along the normal axis 205 and 205' respectively.

Although magnetoresistive stacks 200, 200' may be shown to be of the same width as its corresponding via 105, this is one example. The stacks 200, 200' may have a width less than or greater than the width of a corresponding via 105. In some embodiments, each magnetoresistive stack 200, 200' may be coaxial to a corresponding via 105. A normal axis 205, 205' may pass through each layer of magnetoresistive stack 200, 200' and perpendicular to the top surface of the corresponding via 105.

Referring now to FIG. 3A, after blanket deposition of the multiple layers as shown in FIG. 2, a first etch (e.g., an IBE) may be performed that removes at least a portion of the second magnetic region 160, a portion of the intermediate region 130, and a portion of the first magnetic region 120, exposing a surface of the ILD 100 and/or via 105. This first etch may form distinct second magnetic regions 160, intermediate regions 130, and first magnetic regions 120, for the magnetoresistive stacks 200, 200'.

Referring again to FIG. 2, the ion beam 300 used in the IBE first etch to ablate a portion of the second magnetic region 160, intermediate region 130, and/or first magnetic region 120 may be at an angle θ to the normal axis 205, 205'. In some embodiments, the angle θ may be approximately 0°. During an angled IBE, the angle θ may be greater than or equal to approximately 35° and/or less than approximately 55°. For example, the angle θ may be approximately 35° to approximately 50°, approximately 35° to approximately 45°, approximately 35° to approximately 40°, approximately 40° to approximately 55°, approximately 40° to approximately 50°, approximately 40° to approximately 45°, approximately 45° to approximately 55°, approximately 45° to approximately 50°, or approximately 50° to approximately 55°.

Referring to FIG. 3B, after blanket deposition of the multiple layers as shown in FIG. 2, a first etch (e.g., an RIE) may be performed that removes at least a portion of the second magnetic region 160, a portion of the intermediate region 130, and a portion of the first magnetic region 120, exposing a surface of the ILD 100 and/or via 105. This first etch may form distinct second magnetic regions 160, intermediate regions 130, and first magnetic regions 120, for the magnetoresistive stacks 200, 200'.

Referring again to FIG. 3A, an IBE first etch forms magnetoresistive stacks 200, 200' with straight sidewalls (e.g., sidewalls perpendicular to the top surface of the via 105). Comparatively, the sidewalls of the magnetoresistive stacks 200, 200' formed by an RIE first etch, shown in FIG. 3B, have sloped sidewalls.

In some embodiments, the first etch may be time and/or endpoint controlled or monitored. For example, an etch may be stopped when endpoint monitoring detects the presence, or absence, of a predetermined material composition. For example, the first etch shown in FIGS. 3A and 3B may be terminated when endpoint monitoring detects the presence of the dielectric material from ILD 100 or conductive material from via 105.

After the first etch of the two-step etch process is performed, a second etch (e.g., an IBE or RIE) may remove a portion of each magnetoresistive stack 200, 200' (e.g., a portion including the second magnetic region 160, intermediate region 130, and/or first magnetic region 120), as shown in FIGS. 4A-4D. The second etch may stop after a portion of the first magnetic region 120 is removed. In some embodiments, the second etch may expose the ILD 100, via 105, and/or one or more layers below the first magnetic region 120 (e.g., a bottom electrode layer or spin-Hall material). In some embodiments, the first etch and the second etch may be combined into a single etching step.

In a two-step etch process with the first etch including an IBE, the second etch of that two-step etch process may include an RIE, as shown in FIG. 4A. The second etch including the RIE may be performed on the magnetoresistive structure shown in FIG. 3A. The second etch including the RIE may remove a portion of each magnetoresistive stack 200, 200' (e.g., a portion including the second magnetic region 160, intermediate region 130, and/or first magnetic region 120), as shown in FIG. 4A.

Figure 4B:
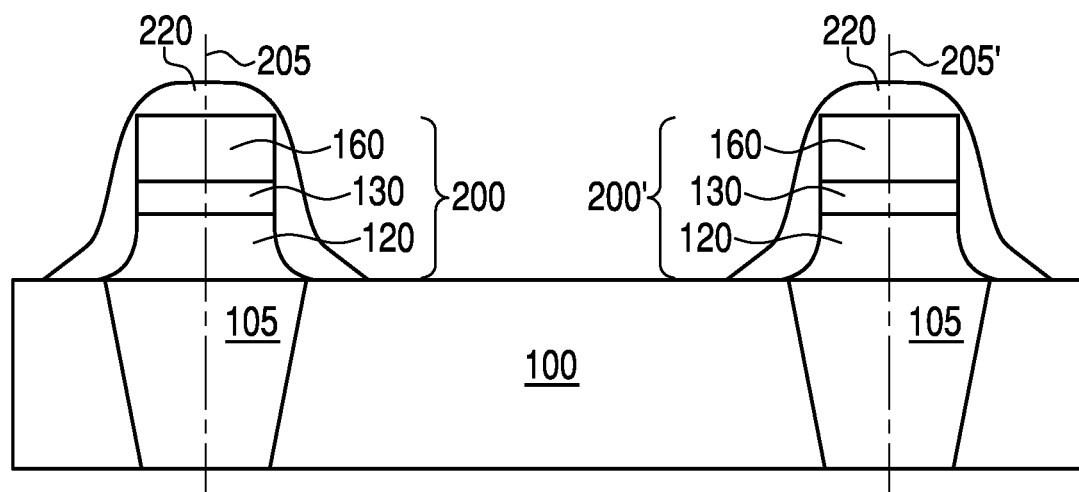
Figure 4C:
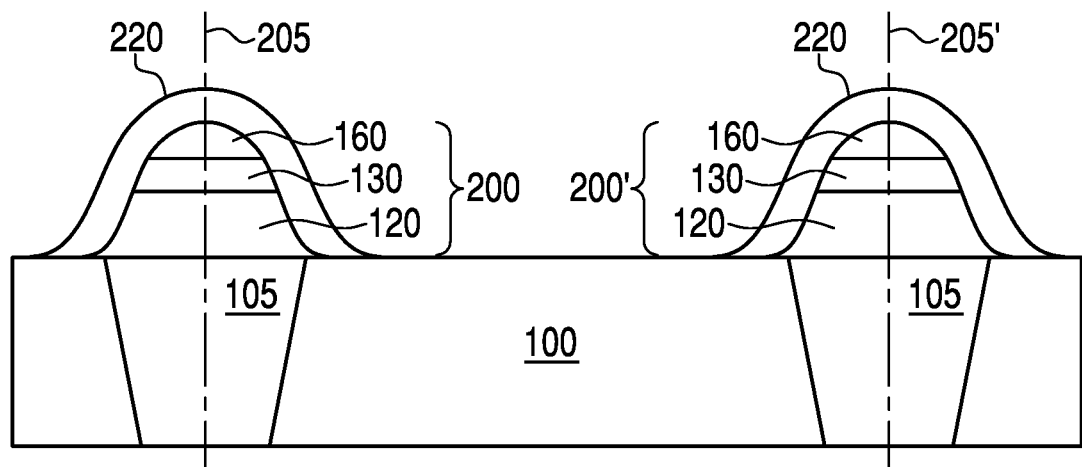
Figure 4D:
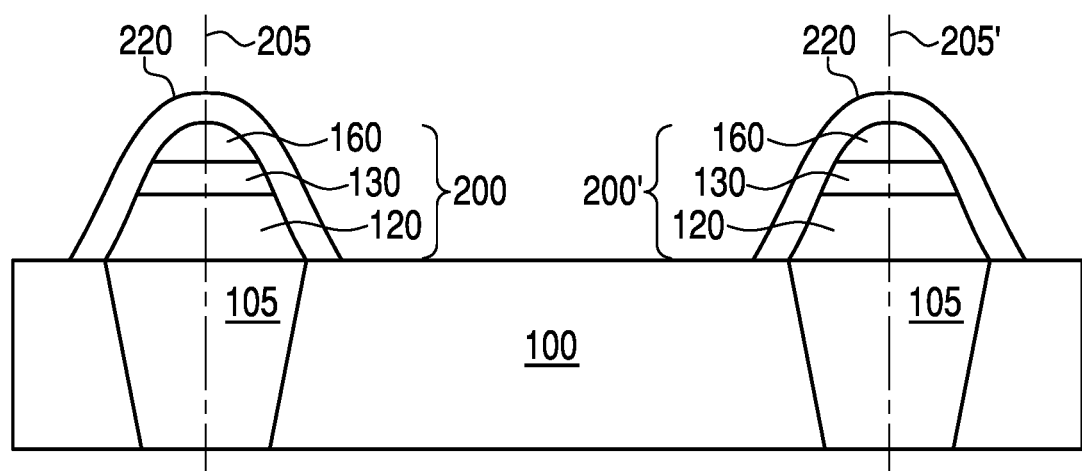

Alternatively, in a two-step etch process with the first etch including an IBE, the second etch of that two-step process may include a second IBE, as shown in FIG. 4B. The second etch including the IBE may be performed on the magnetoresistive structure shown in FIG. 3A. The angled IBE may ablate a portion of each magnetoresistive stack 200, 200' (e.g., a portion including the second magnetic region 160, intermediate region 130, and/or first magnetic region 120) with an ion beam 300 at an angle θ. In some embodiments, the angle θ may be between approximately 35° and approximately 55°.

In a two-step etch process with the first etch including an RIE, the second etch of that two-step etch process may include an IBE (e.g., angled IBE), as shown in FIG. 4C. The second etch including the IBE may be performed on the magnetoresistive structure shown in FIG. 3B. The angled IBE may ablate a portion of each magnetoresistive stack 200, 200' (e.g., a portion including the second magnetic region 160, intermediate region 130, and/or first magnetic region 120) with an ion beam 300 at an angle θ. In some embodiments, the angle θ may be between approximately 35° and approximately 55°. As described previously, an angled IBE with a small angle θ (e.g., less than approximately 35°) may cause damage to a portion of the magnetoresistive device (e.g., may cause oxidation of intermediate region 130). In embodiments comprising a two-step etch process that includes an RIE followed by an angled IBE, the tapered profile of the magnetoresistive stacks 200, 200' created by the RIE mitigates damage (e.g., oxidation of intermediate region 130) traditionally associated with angled IBE. Such embodiments may allow for the angled IBE at a smaller angle θ, without deleteriously affecting the magnetoresistive stack 200, 200'.

Alternatively, in a two-step etch process with the first etch including an RIE, the second etch of that two-step etch process may include an RIE, as shown in FIG. 4D. The second etch including the RIE may be performed on the magnetoresistive structure shown in FIG. 3B. The second etch including the RIE may remove a portion of each magnetoresistive stack 200, 200' (e.g., a portion including the second magnetic region 160, intermediate region 130, and/or first magnetic region 120), as shown in FIG. 4D.

During one or more etching steps, a portion of the removed material (e.g., ablated material from IBE and/or reactive etch product from RIE) may be redeposited on the magnetoresistive stacks 200, 200' (e.g., sidewalls of one or more regions of the magnetoresistive stack 200, 200'). This redeposited material 220 may include materials from the first magnetic region 120, intermediate region 130, second magnetic region 160, and/or materials from one or more regions not shown in the drawings (e.g., an electrode layer, an insertion layer, a seed layer, a second intermediate region, a third magnetic region, a cap region, etc.) that was ablated during a physical etch (e.g., angled IBE). In addition or alternatively, the redeposited material 220 may include byproducts of the first magnetic region 120, intermediate region 130, second magnetic region 160, and/or materials from one or more regions not shown in the drawings (e.g., an electrode layer, an insertion layer, a seed layer, a second intermediate region, a third magnetic region, a cap region, etc.) formed during a reactive etch (e.g., RIE).

Further processing may be required to impart the desired dimensions (e.g., height, width, etc.) and/or shape for the magnetoresistive stacks 200, 200' of a magnetoresistive device. This further processing may be referred to as trimming. Trimming may include removal of the redeposited material 220 formed during earlier etching steps (e.g., formed during the two-step etch process) by etching the redeposited material 220 via a physical etch (e.g., an angled IBE) or RIE. The redeposited material 220 may include both magnetic and non-magnetic materials from multiple regions. Due to the potentially ferromagnetic and electrically conductive properties of the redeposited material 220, the redeposited material 220 may deleteriously affect the functioning of the magnetoresistive stacks 200, 200'.

In addition to ablation of the redeposited material 220 (e.g., via angled IBE or RIE), trimming can include chemical processes that render the redeposited material 220 electrically nonconductive. For example, one or more oxidization processes may render the redeposited material 220 electrically nonconductive and magnetically inert.

After, before, or in lieu of the IBE, trimming of the redeposited material 220 may include an oxidation step. The oxidation step may include adjusting the chamber conditions of the magnetoresistive device (e.g., the conditions in the fabrication chamber) to include a mixture of oxygen ($O_2$), argon (Ar), krypton (Kr), helium (He), nitrogen ($N_2$), ammonia ($NH_3$), carbon monoxide (CO), carbon dioxide ($CO_2$), and/or one or more other non-reactive gases. In some embodiments, the molar ratio of oxygen to non-reactive gas (e.g., argon (Ar)) is approximately 1:3 to approximately 1:10, such as, for example, 1:5. Any ratio of oxygen to non-reactive gas may be employed that renders the redeposited material 220 electrically and magnetically inert without damaging components of the magnetoresistive stacks 200, 200' (e.g., the intermediate region 130). In some embodiments, the ratio of oxygen to non-reactive gas, total flow of gases, and/or duration of the oxidization may be adjusted during an oxidation step to control oxidation of the redeposited material 220. In addition, or alternatively, a voltage bias may be applied or adjusted during an oxidation step.

In some embodiments, trimming may include cyclically repeating oxidation steps with IBE (e.g., angled IBE) and/or RIE. For example, one exemplary trimming process includes three etching/oxidation cycles (e.g., a first angled IBE to remove the redeposited material 220, a first oxidation step to render the redeposited material 220 electrically and magnetically inert, a second angled IBE, a second oxidation step, a third angled IBE, and a third oxidation step). Trimming may include any number of etching/oxidation cycles, such as, for example, 2, 3, 4, 5, 6, 7, 8, 9, or even more cycles.

FIGS. 5A-5D show exemplary magnetoresistive structures formed via a two-step etch process after trimming of the redeposited material 220 via IBE and oxidation, as described previously. The two-step etch process enables the manufacturing of magnetoresistive devices having smaller pitches p than conventional fabrication techniques. Trimming via IBE and oxidation further allows for redeposited material 220 to be removed from magnetoresistive devices fabricated using the two-step etch process, and having smaller pitches p than convention magnetoresistive devices.

Still referring to FIGS. 5A-5D, the methods described herein may be used to manufacture magnetoresistive structures having a pitch p less than or equal to approximately 80 nm, such as for example, less than or equal to approximately 70 nm, less than or equal to approximately 65 nm, less than or equal to approximately 60 nm, approximately 56 nm, approximately 56 nm to approximately 70 nm, approximately 56 nm to approximately 65 nm, or approximately 56 nm to approximately 60 nm. The methods herein may be used for magnetoresistive structures including magnetoresistive stacks having heights less than or equal to approximately 51 nm, less than or equal to approximately 36 nm, or less than or equal to approximately 25 nm.

In embodiments with magnetoresistive stacks having heights less than or equal to approximately 51 nm, the two-step etch process may include an angled IBE with an angle θ less than or equal to approximately 45°, such as, for example, an angle θ of approximately 0° to approximately 35°. In embodiments with magnetoresistive stacks having heights less than or equal to approximately 36 nm, the two-step etch process may include an angled IBE with an angle θ less than or equal to approximately 55°, such as, for example, an angle θ of approximately 35° to approximately 55°, or approximately 45°. In embodiments with magnetoresistive stacks having heights less than or equal to approximately 25 nm, the two-step etch process may include an angled IBE with an angle θ less than or equal to approximately 60°, such as, for example, an angle θ of approximately 35° to approximately 55°, approximately 45° to approximately 55°, or approximately 55°.

As described herein, magnetoresistive structures may have different physical properties based on the manufacturing process. Differences in shape may be caused by the order of etches in the two-step etch process. For example, the magnetoresistive structures shown in FIGS. 5A-5D include the same layers (e.g., a first magnetic region 120, an intermediate region 130, and a second magnetic region 160). However, a top portion (e.g., the portion including the second magnetic region 160 and the intermediate region 130) of the stacks 200, 200' shown in FIGS. 5A and 5B has a larger height than a corresponding top portion of the stacks 200, 200' shown in FIGS. 5C and 5D. This is because the first etch RIE used to manufacture the stacks 200, 200' in FIGS. 5C and 5D removed a greater portion of deposited second magnetic region 160, as compared to the first etch IBE used to manufacture the stacks 200, 200' in FIGS. 5A and 5B. As another example, the stacks 200, 200' shown in FIGS. 5B and 5C, which included a second etch IBE, as part of the two-etch process, have straighter sidewalls (e.g., sidewalls more perpendicular to a top surface of a corresponding via 105), compared to the stacks 200, 200' shown in FIGS. 5A and 5D, which included a second etch RIE, as part of the two-etch process.

Regardless of the resulting shape of the manufactured magnetoresistive structure, the methods described herein enable the fabrication of magnetoresistive devices with smaller pitches p while also preventing, limiting, reducing, or otherwise mitigating damage to the MTJ from the fabrication process (e.g., oxidation of intermediate region 130).

Referring now to FIGS. 6A-6D, after the redeposited material 220 is removed (e.g., via angled IBE and oxidation) as shown in FIGS. 5A-5D, an encapsulation material 400 may be deposited on the magnetoresistive structure to form a conformal coating over the exposed regions of the magnetoresistive stacks 200, 200'. In some embodiments, the encapsulation material 400 may include any electrically nonconductive material, such as, for example, silicon nitride, silicon oxide, aluminum nitride, aluminum oxide, TEOS, etc. In some embodiments, a conductive material, such as, for example, aluminum, magnesium, etc., may first be deposited and then oxidized or nitridized to form the encapsulation material 400. The encapsulation material 400 may be formed by any suitable process, such as, for example, chemical vapor deposition (CVD), atomic layer deposition (ALD), sputtering, etc. In some embodiments, after the redeposited material 220 is removed from the magnetoresistive structure, and prior to the formation of the encapsulation material 400, the magnetoresistive structure may be passivated via water vapor passivation. Other materials and means for depositing an encapsulation material are described in U.S. Pat. Nos. 8,790,935; 8,877,522; 9,548,442; and 9,711,566, each of which is incorporated by reference in its entirety herein.

In some embodiments, after trimming via IBE and oxidation, some residual redeposited material 220 may remain on the magnetoresistive structure (e.g., on the sidewalls of the magnetoresistive stacks 200, 200'). Although not shown in FIGS. 6A-6D, the residual redeposited material 220 may be disposed between one or more regions of the magnetoresistive stacks 200, 200' and encapsulation material 400.

FIG. 7A is a flow chart of a method 500 of manufacturing a magnetoresistive structure using a two-step etch process, according to one or more embodiments of the present disclosure. The method 500 may include forming a magnetoresistive stack 200, 200' above a via 105, wherein the magnetoresistive stack 200, 200' includes a first magnetic region 120, an intermediate region 130, and a second magnetic region 160 (step 501). The method 500 may further include performing a first etch, wherein the first etch includes an IBE (e.g., an angled IBE) and the first etch includes removing a portion of the second magnetic region 160 above the intermediate region 130 (step 502). In some embodiments, the first etch may "over-etch" the second magnetic region 160, which may result in removal of a portion of the intermediate region 130. The method 500 may further include performing a second etch, wherein the second etch includes an RIE and includes removing a portion of the intermediate region 130 and a portion of the first magnetic region 120 (step 503). In some embodiments, the method 500 may further include removing and/or inactivating redeposited material 220 that was formed during the first etch, the second etch, or both (step 504). Optionally, the method 500 may include forming an encapsulation material 400 on the magnetoresistive stacks 200, 200' (e.g., on one or more sidewalls of the magnetoresistive stacks 200, 200').

FIG. 7B is a flow chart of a method 600 of manufacturing a magnetoresistive structure using a two-step etch process, according to one or more embodiments of the present disclosure. The method 600 may include forming a magnetoresistive stack 200, 200' above a via 105, wherein the magnetoresistive stack 200, 200' includes a first magnetic region 120, an intermediate region 130, and a second magnetic region 160 (step 601). The method 600 may further include performing a first etch, wherein the first etch includes an IBE (e.g., an angled IBE) and the first etch includes removing a portion of the second magnetic region 160 above the intermediate region 130 (step 602). In some embodiments, the first etch may "over-etch" the second magnetic region 160, which may result in removal of a portion of the intermediate region 130. The method 600 may further include performing a second etch, wherein the second etch includes an IBE (e.g., an angled IBE) and includes removing a portion of the intermediate region 130 and a portion of the first magnetic region 120 (step 603). In some embodiments, the method 600 may further include removing and/or inactivating redeposited material 220 that was formed during the first etch, the second etch, or both (step 604). Optionally, the method 600 may include forming an encapsulation material 400 on the magnetoresistive stacks 200, 200' (e.g., on one or more sidewalls of the magnetoresistive stacks 200, 200').

FIG. 7C is a flow chart of a method 700 of manufacturing a magnetoresistive structure using a two-step etch process, according to one or more embodiments of the present disclosure. The method 700 may include forming a magnetoresistive stack 200, 200' above a via 105, wherein the magnetoresistive stack 200, 200' includes a first magnetic region 120, an intermediate region 130, and a second magnetic region 160 (step 701). The method 700 may further include performing a first etch, wherein the first etch includes an RIE and the first etch includes removing a portion of the second magnetic region 160 above the intermediate region 130 (step 702). In some embodiments, the first etch may "over-etch" the second magnetic region 160, which may result in removal of a portion of the intermediate region 130. The method 700 may further include performing a second etch, wherein the second etch includes an IBE (e.g., angled IBE) and includes removing a portion of the intermediate region 130 and a portion of the first magnetic region 120 (step 703). In some embodiments, the method 700 may further include removing and/or inactivating redeposited material 220 that was formed during the first etch, the second etch, or both (step 704). Optionally, the method 700 may include forming an encapsulation material 400 on the magnetoresistive stacks 200, 200' (e.g., on one or more sidewalls of the magnetoresistive stacks 200, 200').

FIG. 7D is a flow chart of a method 800 of manufacturing a magnetoresistive structure using a two-step etch process, according to one or more embodiments of the present disclosure. The method 800 may include forming a magnetoresistive stack 200, 200' above a via 105, wherein the magnetoresistive stack 200, 200' includes a first magnetic region 120, an intermediate region 130, and a second magnetic region 160 (step 801). The method 800 may further include performing a first etch, wherein the first etch includes an RIE and the first etch includes removing a portion of the second magnetic region 160 above the intermediate region 130 (step 802). In some embodiments, the first etch may "over-etch" the second magnetic region 160, which may result in removal of a portion of the intermediate region 130. The method 800 may further include performing a second etch, wherein the second etch includes an RIE and includes removing a portion of the intermediate region 130 and a portion of the first magnetic region 120 (step 803). In some embodiments, the method 800 may further include removing and/or inactivating redeposited material 220 that was formed during the first etch, the second etch, or both (step 804). Optionally, the method 800 may include forming an encapsulation material 400 on the magnetoresistive stacks 200, 200' (e.g., on one or more sidewalls of the magnetoresistive stacks 200, 200').

As alluded to above, the magnetoresistive devices (formed using the techniques and/or processes described herein) may be implemented in a sensor architecture or a memory architecture (among other architectures). For example, in a magnetoresistive device having a memory configuration, the magnetoresistive devices may be electrically connected to an access transistor (e.g., a selection transistor) and configured to couple or connect to various conductors, which may carry one or more control signals, as shown in FIGS. 8A and 8B. The magnetoresistive devices may be used in any suitable application, including, e.g., in a memory configuration. In such instances, the magnetoresistive devices may be formed as an IC device comprising a discrete memory device (e.g., as shown in FIG. 9A) or an embedded memory device having a logic therein (e.g., as shown in FIG. 9B), each including MRAM, which, in one embodiment is representative of one or more arrays of MRAM having a plurality of magnetoresistive stacks/structures, according to certain aspects of certain embodiments disclosed herein.

In one embodiments, a method of manufacturing a magnetoresistive device is disclosed. The method includes forming a first magnetic region, an intermediate region, and a second magnetic region of a magnetoresistive stack above a via. The method also includes removing at least a portion of the second magnetic region using a first etch, removing at least a portion of the intermediate region and at least a portion of the first magnetic region using a second etch, removing at least a portion of material redeposited on the magnetoresistive stack using a third etch; and rendering at least a portion of the redeposited material remaining on the magnetoresistive stack electrically non-conductive.

Various embodiments of the disclosed method may additionally or alternatively also include one or more of the following features: the first etch may be one of a reactive ion etch (RIE) and an ion beam etch (IBE), and the second etch may be the other of the RIE and the IBE; the free magnetic region is a free magnetic region and the second magnetic region is a fixed magnetic region; the second magnetic region may be formed on the intermediate region and the intermediate region may be formed on the first magnetic region; the third etch may be an IBE or RIE; rendering at least a portion of the redeposited material electrically non-conductive may include oxidizing at least a first portion of the redeposited material remaining on the magnetoresistive stack, removing the oxidized first portion, oxidizing at least a second portion of the redeposited material remaining on the magnetoresistive stacks, and removing the oxidized second portion; and the first etch may be a reactive ion etch and the second etch may be an ion beam etch at an angle of 35° to 55°. In some embodiments, the method further comprises forming an encapsulation material on the magnetoresistive stack, after rendering at least the portion of the redeposited material remaining on the magnetoresistive stack electrically non-conductive. The magnetoresistive stack may be a first magnetoresistive stack, and the method may further comprise forming a second magnetoresistive stack, wherein a pitch between the first magnetoresistive stack and the second magnetoresistive stack is less than or equal to approximately 70 nm. In some embodiments, rendering at least the portion of the redeposited material remaining on the magnetoresistive stack electrically non-conductive includes oxidizing at least the portion of the redeposited material remaining on the magnetoresistive stack, the oxidizing including exposing the magnetoresistive stack to a mixture of oxygen ($O_2$) and argon (Ar); and a molar ratio of $O_2$ to Ar may be approximately 1:3 to approximately 1:10.

In another embodiment, a method of manufacturing a magnetoresistive device is disclosed. The method may include forming a first magnetic region, an intermediate region, and a second magnetic region of a magnetoresistive stack above a via; removing at least a portion of the second magnetic region using a first etch, wherein the first etch is an ion beam etch (IBE); removing at least a portion of the intermediate region and at least a portion of the first magnetic region using a second etch, wherein the second etch is a reactive ion etch; and trimming at least a portion of redeposited material on the magnetoresistive stack.

Various embodiments of the disclosed magnetoresistive device may additionally or alternatively also include one or more of the following features: the first etch may expose a surface of the intermediate region and the second etch may expose a surface of an interlayer dielectric; and the first etch may be at an angle of approximately 35° to approximately 55°. Trimming at least the portion of redeposited material on the magnetoresistive stack may include at least one of removing at least a portion of materials redeposited on the magnetoresistive stack using a third etch; and rendering at least a portion of the redeposited material remaining on the magnetoresistive stack electrically non-conductive. The redeposited material may be formed during the first etch and/or the second etch.

In another embodiment, a method of manufacturing a magnetoresistive device is disclosed. The method may include forming a free magnetic region, an intermediate region, and a fixed magnetic region of a magnetoresistive stack; performing a first etch of a two-step etch process, wherein the first etch removes at least a portion of the fixed magnetic region; performing a second etch of the two-step etch process, wherein the second etch removes at least a portion of the intermediate region and at least a portion of the free magnetic region; and removing a first redeposited material using a ion beam etch, wherein the first redeposited material is formed during the first etch, the second etch, or both.

The method of manufacturing a magnetoresistive device may further comprise oxidizing a second redeposited material, wherein the second redeposited material was formed during the first etch, the second etch, or both. In addition or alternatively, the method may further comprise, before forming the free magnetic region, the intermediate region, and the fixed magnetic region of the magnetoresistive stack: forming an interlayer dielectric; forming a trench in the interlayer dielectric; and depositing a conductive material in the trench to form a via, wherein the via is coaxial to the magnetoresistive stack, and a width of the via is less than a width of the magnetoresistive stack. The first etch or the second etch may be an angled ion beam etch at an angle of approximately 35° to approximately 55°.

Although various embodiments of the present disclosure have been illustrated and described in detail, it will be readily apparent to those skilled in the art that various modifications may be made without departing from the present disclosure or from the scope of the appended claims.

What is claimed is:

1. A method of manufacturing a magnetoresistive device, the method comprising:
    forming a first magnetic region, an intermediate region, and a second magnetic region of a magnetoresistive stack above a via;
    removing at least a portion of the second magnetic region using a first etch;
    removing at least a portion of the intermediate region and at least a portion of the first magnetic region using a second etch;
    removing at least a portion of material redeposited on the magnetoresistive stack using a third etch;
    rendering at least a portion of the redeposited material remaining on the magnetoresistive stack electrically non-conductive, wherein rendering at least a portion of the redeposited material remaining on the magnetoresistive stack electrically non-conductive includes:
        oxidizing at least a first portion of redeposited material remaining on the magnetoresistive stack;
        removing the oxidized first portion;
        oxidizing at least a second portion of the redeposited material remaining on the magnetoresistive stack; and
        removing the oxidized second portion.

2. The method of claim 1, further comprising, after rendering at least the portion of the redeposited material remaining on the magnetoresistive stack electrically non-conductive, forming an encapsulation material on the magnetoresistive stack.

3. The method of claim 1, wherein the first etch is one of a reactive ion etch (RIE) and an ion beam etch (IBE), and the second etch is the other of the RIE and the IBE.

4. The method of claim 1, wherein the first magnetic region is a free magnetic region and the second magnetic region is a fixed magnetic region.

5. The method of claim 4, wherein the second magnetic region is formed on the intermediate region and the intermediate region is formed on the first magnetic region.

6. The method of claim 1, wherein the third etch is an ion beam etch (IBE) or reactive ion etch (RIE).

7. The method of claim 1, wherein the first etch is a reactive ion etch (RIE) and the second etch is an ion beam etch (IBE) at an angle of approximately 35° to approximately 55°.

8. The method of claim 1, wherein rendering at least the portion of the redeposited material remaining on the magnetoresistive stack electrically non-conductive includes oxidizing at least the portion of the redeposited material remaining on the magnetoresistive stack, the oxidizing including exposing the magnetoresistive stack to a mixture of oxygen ($O_2$) and argon (Ar).

9. The method of claim 8, wherein a molar ratio of $O_2$ to Ar is approximately 1:3 to approximately 1:10.

10. The method of claim 1, wherein the magnetoresistive stack is a first magnetoresistive stack, and the method further comprises forming a second magnetoresistive stack, wherein a pitch between the first magnetoresistive stack and the second magnetoresistive stack is less than or equal to approximately 70 nm.

11. A method of manufacturing a magnetoresistive device, the method comprising:
    forming a first magnetic region, an intermediate region, and a second magnetic region of a magnetoresistive stack above a via;
    removing at least a portion of the second magnetic region using a first etch, wherein the first etch is an ion beam etch (IBE);
    removing at least a portion of the intermediate region and at least a portion of the first magnetic region using a second etch, wherein the second etch is a reactive ion etch (RIE);
    trimming at least a portion of redeposited material on the magnetoresistive stack, wherein trimming at least a portion of redeposited material on the magnetoresistive stack includes:
        removing at least a portion of material redeposited on the magnetoresistive stack using a third etch; and
        rendering at least a portion of the redeposited material remaining on the magnetoresistive stack electrically non-conductive by exposing the magnetoresistive stack to a mixture of oxygen ($O_2$) and argon (Ar).

12. The method of claim 11, wherein the first etch exposes a surface of the intermediate region and the second etch exposes a surface of an interlayer dielectric.

13. The method of claim 11, wherein the first etch is at an angle of approximately 35° to approximately 55°.

14. The method of claim 11, wherein the redeposited material are formed during the first etch and/or the second etch.

15. The method of claim 11, wherein the magnetoresistive stack is a first magnetoresistive stack, and the method further comprises forming a second magnetoresistive stack, wherein a pitch between the first magnetoresistive stack and the second magnetoresistive stack is less than or equal to approximately 70 nm.

16. A method of manufacturing a magnetoresistive device, the method comprising:
    forming a free magnetic region, an intermediate region, and a fixed magnetic region of a magnetoresistive stack;
    performing a first etch of a two-step etch process, wherein the first etch removes at least a portion of the fixed magnetic region;
    performing a second etch of the two-step etch process, wherein the second etch removes at least a portion of the intermediate region and at least a portion of the free magnetic region;
    removing a first redeposited material using an ion beam etch (IBE), wherein the first redeposited material is formed during the first etch, the second etch, or both; and
    rendering at least the portion of the redeposited material remaining on the magnetoresistive stack electrically non-conductive by exposing the magnetoresistive stack to a mixture of oxygen ($O_2$) and argon (Ar).

17. The method of claim 16, further comprising, before forming the free magnetic region, the intermediate region, and the fixed magnetic region of the magnetoresistive stack:
    forming an interlayer dielectric;
    forming a trench in the interlayer dielectric; and
    depositing a conductive material in the trench to form a via,
    wherein the via is coaxial to the magnetoresistive stack and a width of the via is less than a width of the magnetoresistive stack.

18. The method of claim 16, further comprising:
    oxidizing a second redeposited material, wherein the second redeposited material was formed during the first etch, the second etch, or both.

19. The method of claim 16, wherein the first etch or the second etch is an angled ion beam etch at an angle of approximately 35° to approximately 55°.

20. The method of claim 16, wherein the mixture has a molar ratio of $O_2$ to Ar of approximately 1:3 to approximately 1:10.

* * * * *